United States Patent
You

(10) Patent No.: US 12,334,130 B2
(45) Date of Patent: Jun. 17, 2025

(54) MEMORY DEVICE AND METHOD FOR CONTROLLING ROW HAMMER

(71) Applicant: SAMSUNG ELECTRONICS CO., LTD., Suwon-si (KR)

(72) Inventor: Jungmin You, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 351 days.

(21) Appl. No.: 17/880,254

(22) Filed: Aug. 3, 2022

(65) Prior Publication Data

US 2023/0128653 A1    Apr. 27, 2023

(30) Foreign Application Priority Data

Oct. 26, 2021    (KR) .................... 10-2021-0144005

(51) Int. Cl.
| | |
|---|---|
| *G11C 11/4063* | (2006.01) |
| *G11C 11/406* | (2006.01) |
| *G11C 11/4072* | (2006.01) |
| *G11C 11/408* | (2006.01) |

(52) U.S. Cl.
CPC ........ *G11C 11/406* (2013.01); *G11C 11/4072* (2013.01)

(58) Field of Classification Search
CPC .............. G11C 11/406; G11C 11/4072; G11C 11/40611; G11C 11/4063; G11C 11/40622; G11C 11/408
USPC ........................................................ 365/218
See application file for complete search history.

(56) References Cited

U.S. PATENT DOCUMENTS

| | | | |
|---|---|---|---|
| 6,516,320 B1 * | 2/2003 | Odom .................. | G06F 16/902 |
| | | | 707/999.1 |
| 9,589,606 B2 | 3/2017 | Lin et al. | |
| 9,779,798 B1 | 10/2017 | Li et al. | |
| 9,812,185 B2 | 11/2017 | Fisch et al. | |
| 10,475,503 B2 | 11/2019 | Yoo et al. | |

(Continued)

FOREIGN PATENT DOCUMENTS

KR    10-2018-0128711 A    12/2018

OTHER PUBLICATIONS

Y. Park, W. Kwon, E. Lee, T. J. Ham, J. Ho Ahn and J. W. Lee, "Graphene: Strong yet Lightweight Row Hammer Protection," 2020 53rd Annual IEEE/ACM International Symposium on Microarchitecture (MICRO), Athens, Greece, 2020, pp. 1-13 (Year: 2020).*

(Continued)

*Primary Examiner* — Alexander Sofocleous
*Assistant Examiner* — James S Wells
(74) *Attorney, Agent, or Firm* — Sughrue Mion, PLLC

(57) ABSTRACT

Provided are a method for controlling a row hammer and a memory device. The memory device includes: a memory cell array having memory cell rows; a control logic circuit configured to classify access addresses of the memory cell array as real and fake entries, and identify a row hammer address from among the access addresses; and a refresh control circuit configured to refresh a memory cell row physically adjacent to a memory cell row indicated by the row hammer address during a row hammer monitoring time frame. The control logic circuit is further configured to promote a fake entry to a real entry based on the number of accesses of the fake entry being equal to or greater than a first threshold.

20 Claims, 11 Drawing Sheets

(56) References Cited

U.S. PATENT DOCUMENTS

| | | | |
|---|---|---|---|
| 11,037,618 B2 | 6/2021 | Lee et al. | |
| 11,049,544 B2 | 6/2021 | Devaux et al. | |
| 2014/0059287 A1* | 2/2014 | Bains | G11C 11/40622 |
| | | | 711/106 |
| 2017/0117030 A1* | 4/2017 | Fisch | G11C 11/4078 |
| 2021/0174866 A1 | 6/2021 | Chung et al. | |

OTHER PUBLICATIONS

Mungyu Son, Hyunsun Park, J. Ahn and Sungjoo Yoo, "Making DRAM stronger against row hammering," 2017 54th ACM/EDAC/IEEE Design Automation Conference (DAC), Austin, TX, 2017, pp. 1-6 (Year: 2017).*

S. M. Seyedzadeh, A. K. Jones, and R. Melhem, "Counter-Based Tree Structure for Row Hammering Mitigation in Dram," IEEE Computer Architecture Letters, 2017 (Year: 2017).*

S. M. Seyedzadeh, A. K. Jones, and R. Melhem, "Mitigating Wordline Crosstalk Using Adaptive Trees of Counters," in Proceedings of the 45th Annual International Symposium on Computer Architecture, 2018 (Year: 2018).*

* cited by examiner

MEMORY DEVICE AND METHOD FOR CONTROLLING ROW HAMMER

CROSS-REFERENCE TO RELATED APPLICATION

This application claims priority to Korean Patent Application No. 10-2021-0144005, filed on Oct. 26, 2021, in the Korean Intellectual Property Office, the disclosure of which is incorporated by reference herein in its entirety.

BACKGROUND

The present disclosure relates to semiconductor memory devices, and more particularly, to a semiconductor memory device for controlling a row hammer using an entry identifier that distinguishes between a fake entry and a real entry, and an operating method thereof.

Systems using semiconductor chips widely use dynamic random access memory (DRAM) as a working memory or a main memory thereof to store data or instructions used by a host therein and/or to perform a computational operation. In general, DRAM writes data or reads written data under the control by a host. When performing a computational operation, a host retrieves instructions and/or data from DRAM, and uses the data to execute the instructions and/or perform the computational operation. The host may write back a result of the computational operation to DRAM.

As DRAM capacity and density have increased, DRAM cell sizes have decreased. Some DRAM-based systems may experience intermittent failure due to a heavy workload. Such a failure may be caused by repeated accesses to a row of single memory cells, which may be referred to as a row hammer or row hammer event. Memory cells connected to a memory cell row physically adjacent to the repeatedly accessed row may be disturbed by the row hammer, and data corruption may be induced. Memory cells affected by the row hammer may be refreshed by a target row refresh operation.

In order to manage the row hammer, DRAM may monitor one or more hammer addresses that are intensively accessed among the accessed addresses for a certain time. DRAM stores hammer address in defined registers of an address storage, generates a hammer refresh address representing an address of a memory cell row physically adjacent to a memory cell row corresponding to the hammer address, and target-refreshes memory cells connected to the adjacent memory cell row.

However, the address storage has a limited amount of registers to store the hammer addresses. Therefore, an aggressor or other bad actor may generate a decoy row hammer by storing one or more fake entries in the address storage for the purpose of interfering with row hammer management operations of DRAM. As the fake entries are newly stored in the limited registers of the address storage, valid hammer addresses stored in the registers may be evicted from the registers, and the monitored row hammer information may be lost. Therefore, the evicted hammer address is vulnerable to row hammer.

Therefore, there is a need for a countermeasure against a row hammer attack which induces the row hammer information to be lost.

SUMMARY

The present disclosure provides a memory device including a control logic circuit to defend against a row hammer attack, and an operating method thereof.

According to an aspect of an example embodiment, a memory device includes: a memory cell array having a plurality of memory cell rows; a control logic circuit configured to classify access addresses of the memory cell array as real entries and fake entries, and identify a row hammer address from among the access addresses, wherein each of the real entries indicates an access address having a number of accesses equal to or greater than a first threshold, and each of the fake entries indicates an access address having a number of accesses less than the first threshold; and a refresh control circuit configured to refresh a memory cell row physically adjacent to a memory cell row indicated by the row hammer address during a row hammer monitoring time frame. The control logic circuit is further configured to promote a fake entry to a real entry based on the number of accesses of the fake entry being equal to or greater than the first threshold.

According to an aspect of an example embodiment, a memory device includes: a memory cell array having a plurality of memory cell rows; a control logic circuit configured to classify access addresses of the memory cell array as a real entries and fake entries, and identify a row hammer address from among the access addresses, wherein each of the real entries indicates an access address having a number of accesses equal to or greater than a first threshold, and each of the fake entries indicates an access address having a number of accesses less than the first threshold; and a refresh control circuit configured to refresh a memory cell row physically adjacent to a memory cell row indicated by the row hammer address during a row hammer monitoring time frame. The control logic circuit is further configured to adjust a ratio of a first entry space to a second entry space based on a number of evictions, the first entry space is assigned to the real entries, and the second entry space is assigned to the fake entries.

According to an aspect of an example embodiment, an operating method of a memory device including a plurality of memory cell rows, is provided. The operating method includes: classifying access addresses for a memory cell array as real entries and fake entries, wherein each of the real entries indicates an access address having a number of accesses equal to or greater than a first threshold, and each of the fake entries indicates an access address having a number of accesses less than the first threshold; identifying a row hammer address from among the access addresses; promoting a fake entry to a real entry based on the number of accesses of the fake entry being equal to or greater than the first threshold; and refreshing a memory cell row physically adjacent to a memory cell row indicated by the row hammer address during a row hammer monitoring time frame.

BRIEF DESCRIPTION OF THE DRAWINGS

The above and other aspects will be more apparent from the following description of example embodiments taken in conjunction with the accompanying drawings, in which.

DETAILED DESCRIPTION

Hereinafter, example embodiments will be described in detail with reference to the accompanying drawings.

Figure 1:
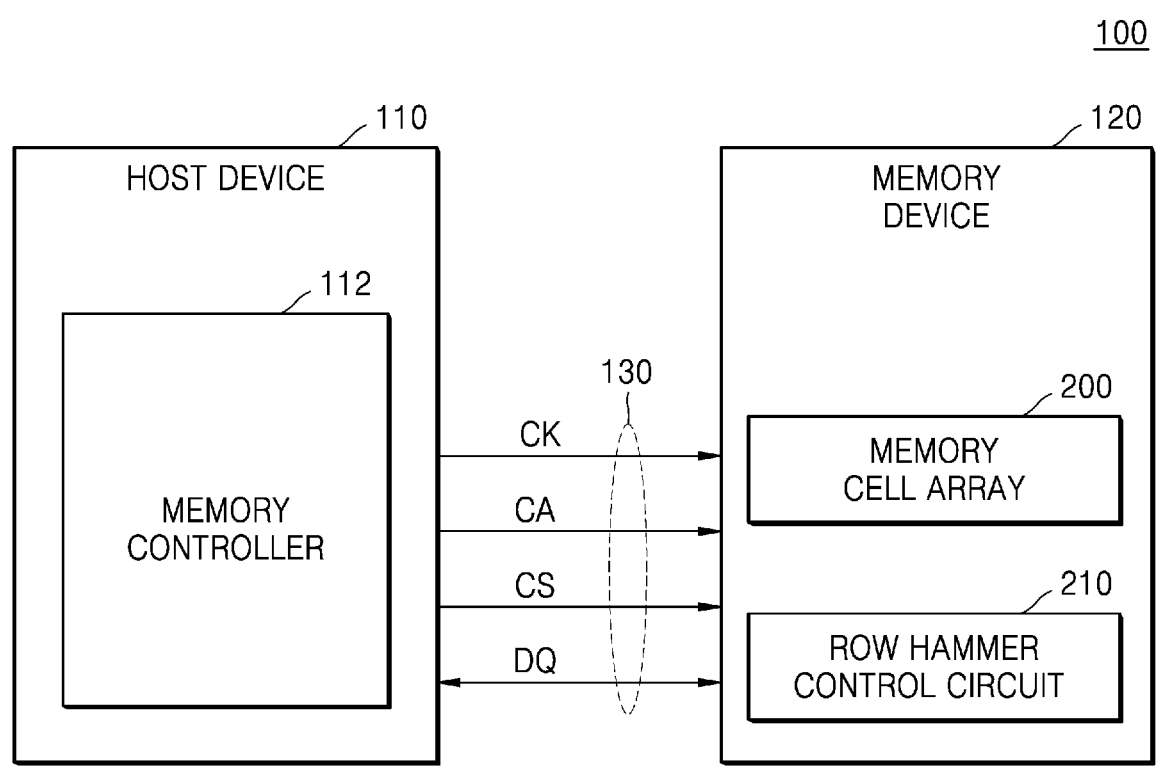
FIG. 1 is a diagram illustrating a system including a memory device controlling a row hammer according to example embodiments.

FIG. 1 is a diagram illustrating a system 100 including a memory device 120 to example embodiments.

Referring to FIG. 1, the system 100 may include a host device 110 and the memory device 120. The host device 110 may be communicatively connected to the memory device 120 through a memory bus 130.

The host device 110 may include, for example, a computing system such as a computer, a notebook computer, a server, a workstation, a portable communication terminal, a personal digital assistant (PDA), a portable multimedia player (PMP), a smartphone, or a wearable device. Alternatively, the host device 110 may be a part of components included in a computing system such as a graphics card.

The host device 110, as a functional block performing general computational operations in the system 100, may correspond to (or include) a central processing unit (CPU), a digital signal processor (DSP), a graphics processing unit (GPU) or an application processor (AP). The host device 110 may include a memory controller 112 configured to control transmission/reception of data to/from the memory device 120.

The memory controller 112 may access the memory device 120 according to a memory request from the host device 110. The memory controller 112 may include a memory physical layer interface (memory PHY) configured to interface with the memory device 120 by, for example, selecting rows and columns corresponding to a memory location, writing data to a memory location, or reading written data. The memory PHY may include a physical or electrical layer and a logical layer provided for signals, frequency, timing, driving, detailed operating parameters, and functionality required for efficient communication between the memory controller 112 and the memory device 120. The memory PHY may support features of a double data rate (DDR) and/or low power DDR (LPDDR) protocol of the Joint Electron Device Engineering Council (JEDEC) standard.

The memory controller 112 and the memory device 120 may be connected through the memory bus 130. For clarity, it is illustrated that a clock signal CK, a command/address signal CA, and data DQ are provided through one signal line in the memory bus 130 between the memory controller 112 and the memory device 120. However, example embodiments are not limited thereto and the clock signal CK, command/address signal CA, and data DQ may be provided through a plurality of signal lines or buses. The signal lines between the memory controller 112 and the memory device 120 may be connected through connectors. The connectors may be implemented as pins, balls, signal lines, or other hardware components.

The clock signal CK may be transmitted from the memory controller 112 to the memory device 120 through a clock signal line of the memory bus 130. The command/address signal CA may be transmitted from the memory controller 112 to the memory device 120 through the command/address signal CA bus of the memory bus 130. A chip select CS signal may be transmitted from the memory controller 112 to the memory device 120 through a chip select CS line of the memory bus 130. For example, a signal transmitted through the command/address signal CA bus when the chip select CS signal is a logic high may be a command. The data DQ may be transmitted from the memory controller 112 to the memory device 120 or from the memory device 120 to the memory controller 112 through the data DQ bus of the memory bus 130, which may include bidirectional signal lines.

The memory device 120 may write the data DQ or read the data DQ and perform a refresh operation under the control by the memory controller 112. For example, the memory device 120 may be a DDR synchronous dynamic random access memory (DDR SDRAM) device. However, the scope of the present disclosure is not limited thereto, and the memory device 120 may include any one of volatile memory devices such as LPDDR SDRAM, wide I/O DRAM, high bandwidth memory (HBM), a hybrid memory cube (HMC), and the like. The memory device 120 may include a memory cell array 200 and a row hammer control circuit 210.

The memory cell array 200 may include a plurality of word lines and a plurality of bit lines, and a plurality of memory cells formed at intersections of the word lines and the bit lines. A memory cell of the memory cell array 200 may be a volatile memory cell, for example, a DRAM cell.

The row hammer control circuit 210 may evict a real row hammer address that is intensively accessed from an address storage to prevent a row hammer of a hacker pattern that causes row hammer information to be lost by maliciously evicting. The row hammer control circuit 210 may mark a low rate in a fake entry by using an address table including an entry identifier that distinguishes between a fake entry and a real entry. The address table may include double rating registers. The row hammer control circuit 210 may promote a fake entry having the number of accesses exceeding a first threshold to a real entry, demote a real entry having the lowest number of accesses to a fake entry, and initialize the number of accesses of the demoted real entry to a fake entry. The row hammer control circuit 210 may evict a fake entry having the lowest number of accesses during a row hammer monitoring time frame from the address table, and store the number of evictions. The row hammer control circuit 210 may compare a first number of evictions of a current row hammer monitoring time frame with a second number of evictions of a previous row hammer monitoring time frame and adjust an entry ratio of fake entries to real entries stored in the address table. Because the row hammer control circuit 210 selectively evicts a less intensive row hammer address, among the row hammer addresses stored in the address table, a row hammer of a hacker pattern may be alleviated.

Figure 2:
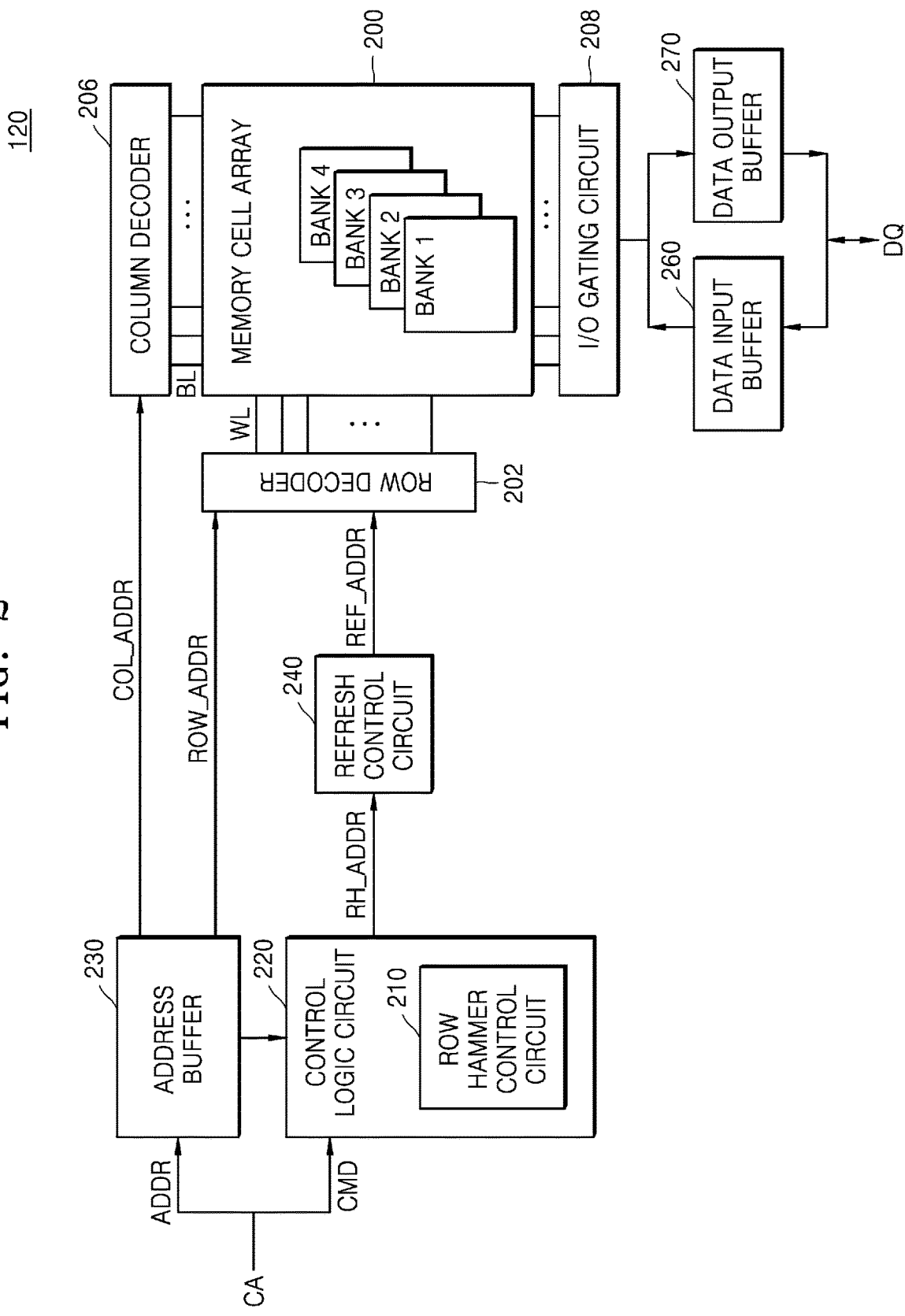
FIG. 2 is a block diagram illustrating a memory device according to example embodiments.

FIG. 2 is a block diagram illustrating the memory device 120 according to example embodiments. FIG. 2 shows the memory device 120 of FIG. 1 implemented with DRAM. It may be noted that a DRAM configuration shown in FIG. 2 is provided as an example and example embodiments are not limited thereto.

Referring to FIGS. 1 and 2, the memory device 120 may include a memory cell array 200, a row decoder 202, a column decoder 206, an input/output (I/O) gating circuit 208, a control logic circuit 220, an address buffer 230, a refresh control circuit 240, a data input buffer 260, and a data output buffer 270. The memory device 120 may further include a clock buffer, a mode register set (MRS), bank control logic, a voltage generating circuit, and the like.

The address buffer 230 may receive an address ADDR indicating a bank address, a row address ROW_ADDR, and a column address COL ADDR from the memory controller 112. The address buffer 230 may provide the bank address to the bank control logic, provide the row address ROW_ADDR to the row decoder 202, and provide the column address COL ADDR to the column decoder 206.

The memory cell array 200 includes a plurality of memory cells provided in a matrix form arranged in rows and columns. The memory cell array 200 includes a plurality of word lines WL and a plurality of bit lines BL connected to the memory cells. The word lines WL may be connected to rows of the memory cells, and the bit lines BL may be connected to columns of the memory cells. Data of memory cells connected to an activated word line WL may be sensed and amplified by sense amplifiers connected to the bit lines BL.

The memory cell array 200 may include first to fourth banks BANK1 to BANK4. The bank control logic may generate bank control signals in response to a bank address, and in response to the bank control signals, the row decoder 202 and the column decoder 206 of a bank corresponding to the bank address, among the first to fourth banks BANK1 to BANK4, may be activated. Although an example is described with respect to the memory device 120 including four banks, example embodiments are not limited thereto and the memory device 120 may include any number of banks.

The row decoder 202 and the column decoder 206 may be disposed to correspond to each of the first to fourth banks BANK1 to BANK4, and the row decoder 202 and the column decoder 206 connected to a bank corresponding to a bank address may be activated. The row decoder 202 may decode a row address ROW_ADDR received from the address buffer 230, select a word line WL corresponding to the row address ROW_ADDR, among the word lines WL, and connect the selected word line WL to a word line driver that activates the word line WL.

The column decoder 206 may select certain bit lines BL, among the bit lines BL of the memory cell array 200. The column decoder 206 may decode burst addresses that are gradually increased by +1 each time based on the column address COL ADDR in the burst mode to generate a column select signal and connect bit lines BL selected by the column select signal to the I/O gating circuit 208. The burst addresses refer to addresses of column locations that may be accessed in relation to burst length BL for read and/or write commands.

The I/O gating circuit 208 may include read data latches which may store read data of the bit lines BL selected by the column select signal and a write driver which may write data into the memory cell array 200. The read data stored in the read data latches of the I/O gating circuit 208 may be provided to the data DQ bus through the data output buffer 270. The write data may be written to the memory cell array 200 through the data input buffer 260 connected to the data DQ bus and through the write driver of the I/O gating circuit 208.

The control logic circuit 220 may receive the clock signal CK and the command CMD, and generate control signals for controlling an operation timing and/or a memory operation of the memory device 120. The control logic circuit 220 may provide control signals to circuits of the memory device 120 to control the memory device 120 to operate according to operation and control parameters stored by the MRS. The control logic circuit 220 may read data from the memory cell array 200 and write data to the memory cell array 200 according to the control signals. Although the control logic circuit 220 and the address buffer 230 are illustrated as separate components in FIG. 2, the control logic circuit 220 and the address buffer 230 may be implemented as one inseparable component. In addition, although it is illustrated that the command CMD and the address ADDR are provided as separate signals in FIG. 2, the address ADDR may be included in the command CMD as provided by the LPDDR standard or the like.

The control logic circuit 220 may be configured to identify one or more row hammer addresses corresponding to rows that are intensively accessed during a row hammer monitoring time frame, and target-refresh one or more memory cell rows physically adjacent to the one or more memory cell rows corresponding to the one or more row hammer addresses. The control logic circuit 220 may control a row hammer of a hacker pattern inducing row hammer information to be lost by maliciously evicting a real row hammer address, which is being intensively accessed, by an aggressor, from the address storage.

The control logic circuit 220 may mark a row hammer address corresponding to a low access rate as a fake entry and a row hammer address corresponding to a high access rate as a real entry by using the address table including an entry identifier that distinguishes between a fake entry and a real entry. When a number of accesses corresponding to a fake entry exceeds a threshold number, the control logic circuit 220 may promote the fake entry having the number of accesses exceeding the threshold to a real entry and demote a real entry having the lowest number of accesses to a fake entry.

The control logic circuit 220 may evict a fake entry having the lowest number of accesses during a row hammer monitoring time frame from the address table, and store the number of evictions. The control logic circuit 220 may compare a first number of evictions of a current row hammer monitoring time frame with a second number of evictions of a previous row hammer monitoring time frame, and adjust an entry ratio of fake entries to real entries stored in the address table. Because the control logic circuit 220 selectively evicts a less intensive row hammer address, among the row hammer addresses stored in the address table, a row hammer of a hacker pattern may be alleviated.

The control logic circuit 220 may include a row hammer control circuit 210 configured to control the row hammer of the hacker pattern during the row hammer monitoring time frame. The row hammer control circuit 210 is described below with reference to FIG. 3. In the following, it is described that the row hammer control circuit 210 controls the row hammer of the hacker pattern, but example embodiments are not limited thereto. For example, the row hammer control circuit 210 may correspond to a component provided in the control logic circuit 220, and the control logic circuit 220 may control the row hammer of the hacker pattern.

The control logic circuit 220 may control the refresh control circuit 240 to perform a normal refresh operation by increasing a refresh counter value by ±1 each time in response to the refresh command CMD. Also, the control logic circuit 220 may control the refresh control circuit 240 to perform a target row refresh operation based on one or more row hammer addresses RH ADDR. The refresh control circuit 240 may generate a refresh address REF_ADDR corresponding to a memory cell row on which the normal refresh operation and/or the target row refresh operation is to be performed.

Figure 3:
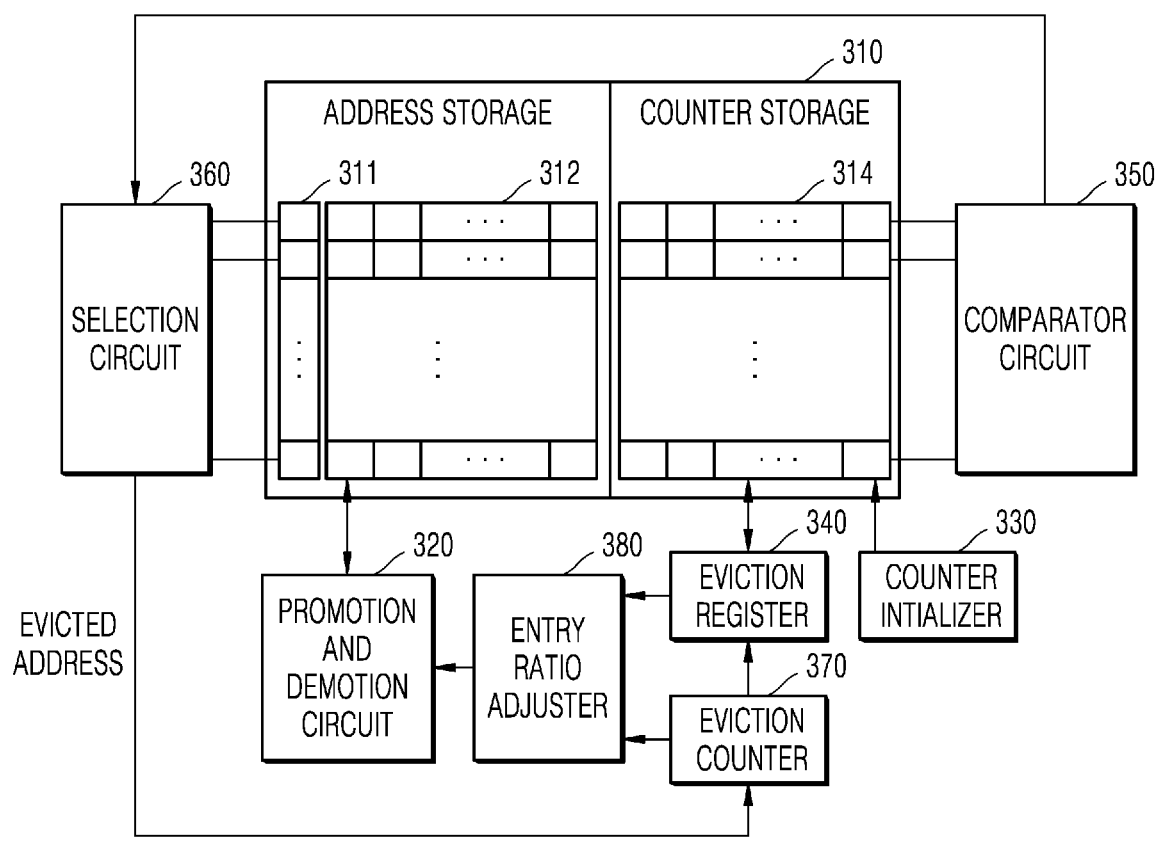
FIG. 3 is a block diagram illustrating a row hammer control circuit according to example embodiments.
Figure 4:
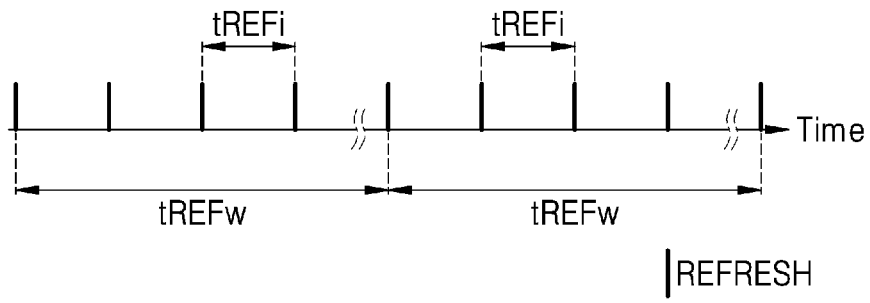
FIG. 4 is a timing diagram illustrating a refresh operation of the memory device of FIG. 2.
Figure 5:
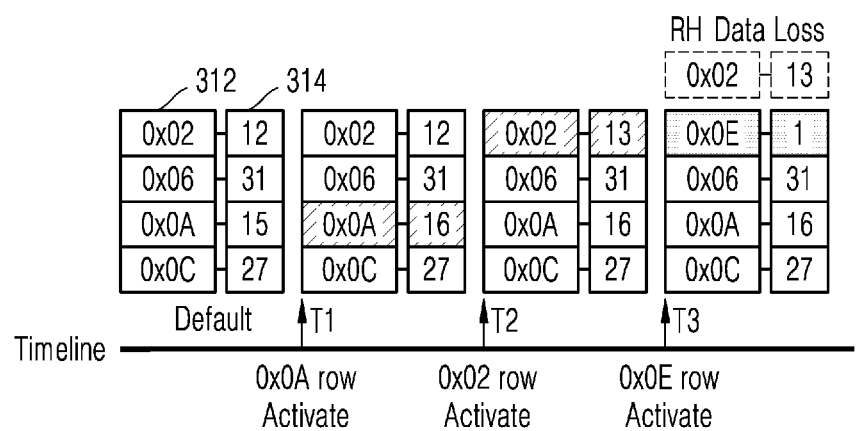
FIG. 5 is a diagram conceptually illustrating an example in which an address table of FIG. 3 is reconfigured.

FIG. 3 is a block diagram illustrating the row hammer control circuit 210 according to example embodiments. FIG. 4 is a timing diagram illustrating a refresh operation of the memory device 120 of FIG. 2. FIG. 5 is a diagram conceptually illustrating an example in which the address table of FIG. 3 is reconfigured. Hereinafter, the row hammer control circuit 210 collectively refers to elements implemented in hardware (for example, circuitry such as transistors, capacitors, logic gates, and other circuit elements to implement certain functionality described in more detail below), firmware, software, or a combination thereof for controlling or managing a row hammer.

Referring to FIGS. 2 and 3, the row hammer control circuit 210 may be configured to monitor a row hammer for one or more memory cell rows in the memory cell array 200 and detect a row hammer for a certain memory cell row. The certain memory cell row refers to a memory cell row having a maximum number of accesses or a maximum number of active commands during a certain period of time. The certain period of time may be set to a 32 ms or 64 ms refresh window time tREFw in accordance with the JEDEC standard. According to an example embodiment, the certain period of time may be set as a basic refresh rate time tREFi of FIG. 4. The basic refresh rate is defined as, for example, the number of refresh commands REFRESH of 8K within a 32 ms refresh window. Hereinafter, the certain period of time may refer to a row hammer monitor time frame or time window set by the control logic circuit 220.

The row hammer control circuit 210 may detect one or more row hammer addresses that are intensively accessed during the row hammer monitoring time frame and control a row hammer of a hacker pattern. The row hammer control circuit 210 may include an address table 310, a promotion and demotion circuit 320, a counter initializer 330, an eviction register 340, a comparison circuit 350, a selection circuit 360, an eviction counter 370, and an entry ratio adjuster (i.e., adjustment circuit) 380.

The address table 310 may be implemented as a logic circuit configured to indicate a correlation between the one or more row hammer addresses and the number of accesses of a corresponding row hammer address. The address table 310 may include registers assigned to an address storage 312 and a counter storage 314. As shown in FIG. 5, the address storage 312 and the counter storage 314 may store one or more access addresses for activating a memory cell row of the memory cell array 200 and the number of accesses. The example of the address table 310 shown in FIG. 5 includes four registers and may be reconfigured according to time points T1 to T3.

In FIG. 5, it is assumed that a 0x02 address entry having the number of accesses of 12, a 0x06 address entry having the number of accesses of 31, a 0x0A address entry having the number of accesses of 15, and a 0x0C address entry having the number of accesses of 27 are pre-stored in the address storage 312 and the counter storage 314 of the address table 310 in a default state.

When an access address corresponding to a 0x0A memory cell row is applied at the time point T1, the number of accesses of the 0x0A address entry stored in the address storage 312 may be increased by 1 from 15 to 16. When an access address corresponding to a 0x02 memory cell row is applied at the time point T2, the number of accesses of the 0x02 address entry stored in the address storage 312 may be increased by 1 from 12 to 13. Thereafter, at the time point T3, an access address corresponding to a 0x0E memory cell row may be applied. The new 0x0E address entry may be stored in the address table 310, but there is no empty space because the address table 310 is full. Accordingly, the 0x02 address entry having the lowest number of accesses of 13 may be evicted, and the 0x0E address entry may be stored with the number of accesses of 1 in an evicted location. The 0x02 address entry, which is evicted, is an address having the lowest number of accesses in the address table 310, but as the 0x02 address entry is evicted from the address table 310, row hammer data for the 0x02 address may be lost.

In this manner, an aggressor may use fake entries stored in the address table 310 for the purpose of causing the row hammer addresses to be evicted from the address table 310. In order to prevent an attack of a hacker pattern such as fake entries, the address storage 312 needs to be configured to distinguish between fake entries entry(s) and real entries. The address storage 312 may include an entry identifier 311 that distinguishes a fake entry from a real entry. As an example, a "1" bit of the entry identifier 311 may indicate a real entry, and a "0" bit thereof may indicate a fake entry.

Referring back to FIG. 3, the address storage 312 in the address table 310 may indicate the entry identifier 311 for each of the access addresses to be classified into a fake entry and a real entry. The counter storage 314 may store the number of accesses of the fake entries and the real entries.

When the number of accesses to a fake entry stored in the address table 310 is equal to or greater than a first threshold TH1, the promotion and demotion circuit 320 may promote the fake entry to a real entry. The promotion and demotion circuit 320 may store the promoted fake entry in a first entry space assigned to the real entries in the address table 310. If there is no empty space in the first entry space, the promotion and demotion circuit 320 may swap a real entry having the lowest number of accesses stored in the address table 310 with the fake entry being promoted. The promotion and demotion circuit 320 may demote a real entry having the lowest number of accesses to a fake entry.

The counter initializer 330 may initialize the number of accesses of the new fake entry stored in the address table to 1. The counter initializer 330 may initialize an access count value of the real entry demoted by the promotion and demotion circuit 320 to a value that is less than the first threshold value TH1 by 1. The counter initializer 330 may initialize the access count value of the row hammer address corresponding to a target-refresh operation performed by the refresh control circuit 240 to the first threshold value TH1.

The comparison circuit 350 may be configured to identify the highest value or the lowest value, among the number of accesses of the real entries stored in the address table 310. Also, the comparison circuit 350 may be configured to identify the lowest value or a value equal to the first threshold TH1, among the number of accesses of the fake entries stored in the address table 310.

The selection circuit 360 may support a target row refresh operation to be performed on rows that are adjacent a row indicated by a real entry having the highest number of accesses. The selection circuit 360 may support a fake entry having a number of accesses greater than or equal to the first threshold TH1 to be promoted to a real entry by the promotion and demotion circuit 320, and support a real entry having the lowest number of accesses to be demoted to a fake entry by the promotion and demotion circuit 320. The selection circuit 360 may support a fake entry having the lowest number of accesses to be evicted.

The eviction register 340 may store a first number of evictions of fake entries evicted during a previous row hammer monitoring time frame. The eviction counter 370 may store a second number of evictions of fake entries evicted during a current row hammer monitoring time frame.

The entry ratio adjuster 380 may compare the first number of evictions with the second number of evictions, and adjust a ratio of a first entry space assigned to the real entries to a second entry space assigned to fake entries in the address table 310 based on the comparison. When the second number of evictions is greater than the first number of evictions, the entry ratio adjuster 380 may reduce the first entry space. When the second number of evictions is less than the first number of evictions, the entry ratio adjuster 380 may expand the first entry space.

Figure 6:
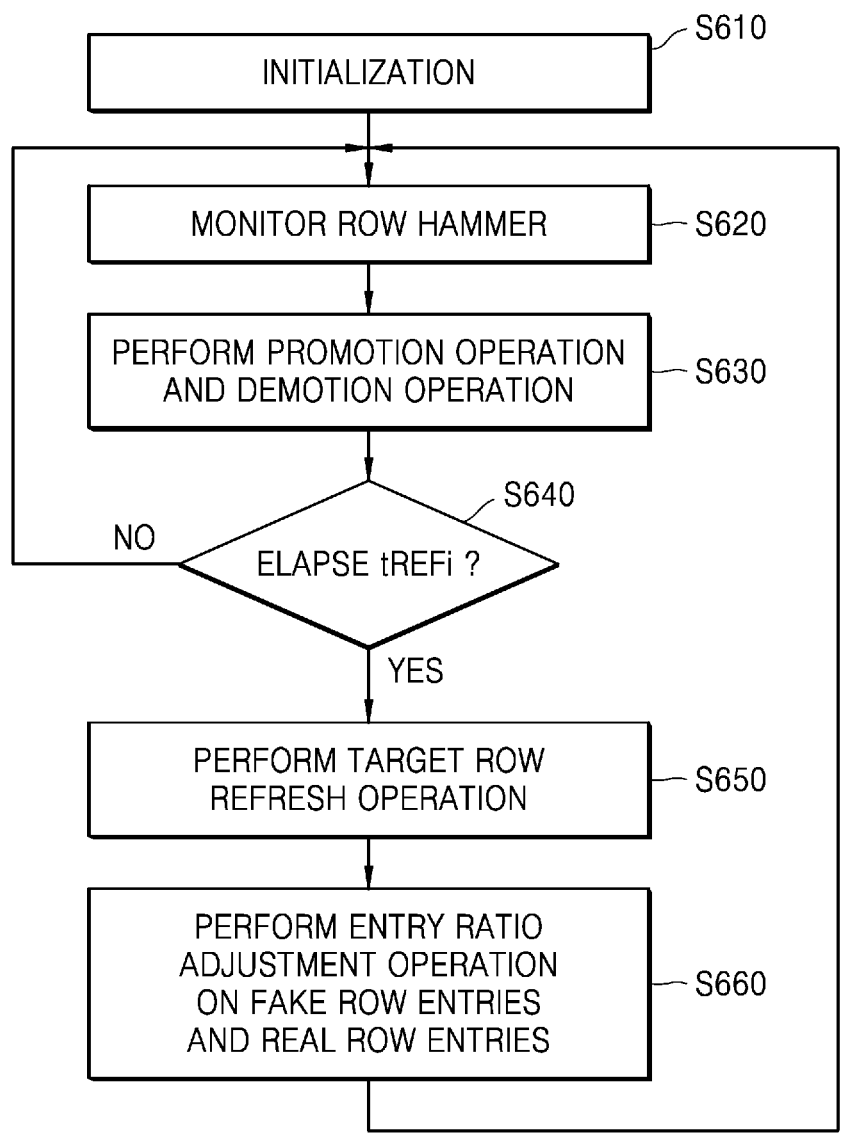
FIG. 6 is a flow diagram illustrating an operation of a control logic circuit according to example embodiments.

FIG. 6 is a flow diagram illustrating an operation of a control logic circuit according to example embodiments.

Referring to FIG. 6 in conjunction with FIGS. 1 to 5, the system 100 may perform initialization in operation S610. When the system 100 is powered up, the memory controller 112 and the memory device 120 may perform an initial setting operation according to a certain method. Default operation parameters may be set when the memory device 120 is initialized. For example, the first threshold TH1 (FIG. 7) as a criterion for promoting a fake entry stored in the address table 310 to a real entry may be set. A minimum entry value (MIN, FIG. 7) and a maximum entry value (MAX, FIG. 7) of a real entry, which are criteria for adjusting the ratio of fake entries to real entries stored in the address table 310, may be set. Also, a row hammer monitor time frame tREFi may be set.

In operation S620, the control logic circuit 220 may perform an operation of monitoring a row hammer. In the operation of monitoring a row hammer (operation S620), the control logic circuit 220 may count the number of accesses to the addresses accessed during the row hammer monitoring time frame tREFi and indicate the entry identifier 311 for each of the accessed addresses to distinguish between a fake entry and a real entry, and store each of the entry identifiers 311 in the address table 310.

In operation S630, the control logic circuit 220 may perform promotion and demotion operations on the fake entries and the real entries stored in the address table 310 acquired in operation S620. When the number of accesses to the fake entry is equal to or greater than the first threshold TH1, the control logic circuit 220 may promote the corresponding fake entry to a real entry. If there is no empty space in the first entry space assigned to the real entries in the address table 310, the control logic circuit 220 may demote the real entry having the lowest number of accesses to a fake entry. The control logic circuit 220 may store the promoted fake entry in place of the demoted real entry.

In operation S640, the control logic circuit 220 may determine whether the row hammer monitor time frame tREFi has elapsed. If the row hammer monitor time frame tREFi has not elapsed (NO), the process may proceed to operations S620 and S630. The control logic circuit 220 may repeatedly perform the row hammer monitoring operation on the fake entries and the real entries acquired in operations S620 and S630. If the row hammer monitor time frame tREFi has elapsed (YES), the process may proceed to operation S650.

In operation S650, the control logic circuit 220 may perform a target row refresh operation on rows that are adjacent a row indicated by a real entry having the maximum number of accesses acquired in operations S620 and S630. The control logic circuit 220 may initialize a count value of the real entry corresponding to the target row refresh operation, to the first threshold value TH1 (e.g., 3). The reason for initializing the count value to the first threshold value TH1 is to set the target refreshed row hammer address to the real entry having the minimum number of accesses in relation to the criterion for promoting the fake entry to the real entry.

In operation S660, the control logic circuit 220 may perform an operation of adjusting an entry ratio of the fake entry and the real entry stored in the address table 310. The control logic circuit 220 may store the first number of evictions of the fake entries that were evicted during the previous row hammer monitoring time frame. The control logic circuit 220 may compare the first number of evictions with the second number of evictions of the fake entries that are evicted during the current row hammer monitoring time frame, and adjust a ratio of the first entry space assigned to the real entries and the second entry space assigned to the fake entries in the address table 310. When the second number of evictions is greater than the first number of evictions, the control logic circuit 220 may contract the first entry space. When the second number of evictions is less than the first number of evictions, the control logic circuit 220 may expand the first entry space.

Figure 7:
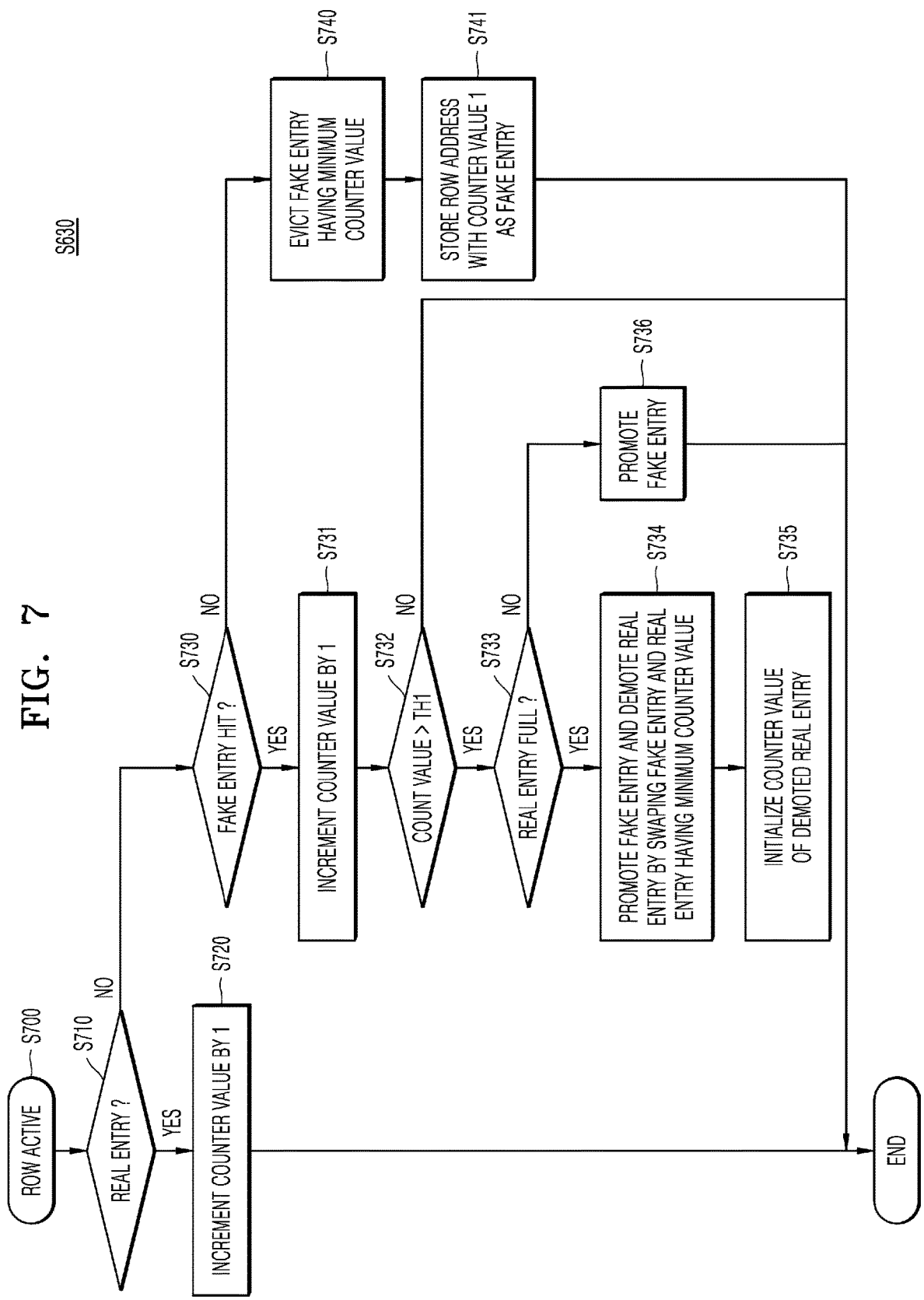
FIG. 7 is a flow diagram illustrating an operation of a control logic circuit according to example embodiments.

FIG. 7 is a flow diagram illustrating an operation of the control logic circuit 220 according to example embodiments. FIG. 7 is a flow diagram illustrating the row hammer monitoring operation (operation S620), and promotion and demotion operation (operation S630) on fake entries and real entries described with reference to FIG. 6. FIGS. 8 to 12 are diagrams illustrating an address table 310 reconfigured for each of time points Ta to Te according to the operation flows of FIGS. 6 and 7.

Figure 8:
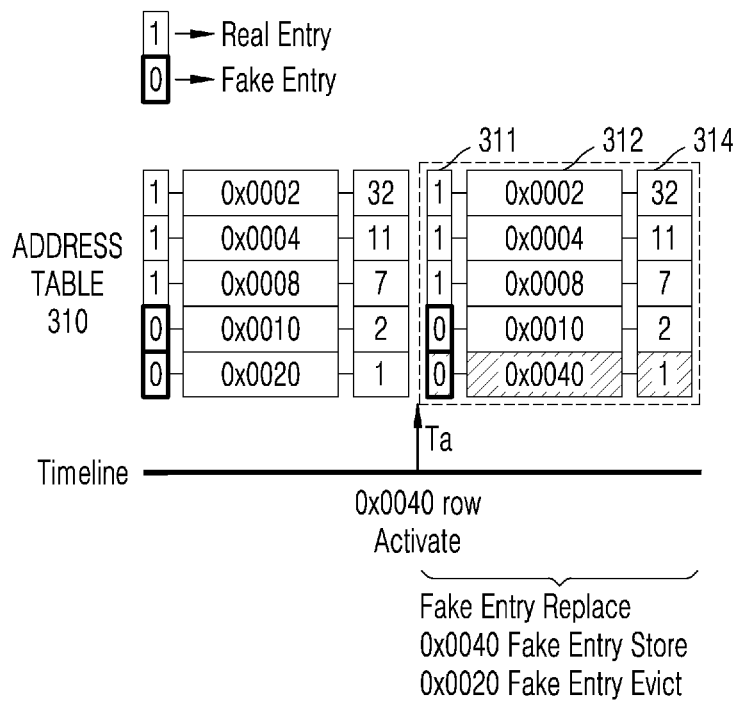
FIGS. 8 to 12 are diagrams illustrating an address table reconfigured according to the operation flows of FIGS. 6 and 7.

First, by the row hammer monitoring operation (operation S620) described with reference to FIG. 6, the control logic circuit 220 may determine a row address in which the number of accesses thereto is equal to or greater than the first threshold value TH1, to be a real entry, and determine a row address in which the number of accesses thereto is less than the first threshold value TH1, to be a fake entry. As an example, the first threshold TH1 may be set to 3. It is assumed that the address storage 312 and the counter storage 314 of the address table 310 include five double-level registers as shown in FIG. 8. The entry identifier 311 included in the address storage 312 may indicate whether a row address stored in the address storage 312 is a real entry or a fake entry. As an example, a "1" bit of the entry identifier 311 may indicate a real entry, and a "0" bit thereof may indicate a fake entry. As an example, in the address table 310 of FIG. 8, each of address entries 0x0002, 0x0004, and 0x0008 may represent a real entry having the number of accesses greater than or equal to the first threshold TH1 of 3, and each of the address entries 0x0010 and 0x0020 may represent a fake entry having the number of accesses less than the first threshold value TH1 of 3.

Referring to FIG. 7 in conjunction with FIGS. 1 to 6, in operation S700, the control logic circuit 220 may receive a row address together with a row active command. In operation S710, the control logic circuit 220 may determine whether the received row address matches a real entry stored in the address table 310. As a result of the determination, if the received row address matches a stored real entry (YES), the process may proceed to operation S720; however, if the received row address does not match a real entry (NO), the process may proceed to operation S730. In operation S720, the control logic circuit 220 may increase a counter value of the corresponding real entry by 1.

In operation S730, the control logic circuit 220 may determine whether the received row address matches a fake entry stored in the address table 310. As a result of the determination, if the received row address matches the stored fake entry (YES), the process may proceed to operation S731; however, if the received row address does not match the stored fake entry (NO), the process may proceed to operations S740 and S741.

In operation S740, the control logic circuit 220 may evict the fake entry having the lowest number of accesses from the address table 310 using the comparison circuit 350 and the selection circuit 360. In this case, the number of evictions of the fake entry may be stored in the eviction counter 370. In operation S741, a newly received row address may be replaced and stored in the space of the address table 310 from which the fake entry is evicted. Here, the received row address may be stored as a fake entry having an address counter value of 1.

Operations S740 and S741 may be performed at the time point Ta of FIG. 8. At the time point Ta, a new 0x0040 row address may be accessed. When the new 0x0040 row address is activated, the control logic circuit 220 may evict the 0x0020 fake entry having the lowest number of accesses of 1 among the fake entries stored in the address table 310 (operation S740). The control logic circuit 220 may store the 0x0040 fake entry having an address counter value of 1 in the address table 310 from which the 0x0020 fake entry is evicted (operation S741).

In operation S731, the control logic circuit 220 may increase the counter value of the fake entry stored in the address table 310 matching the received row address by 1.

Figure 11:
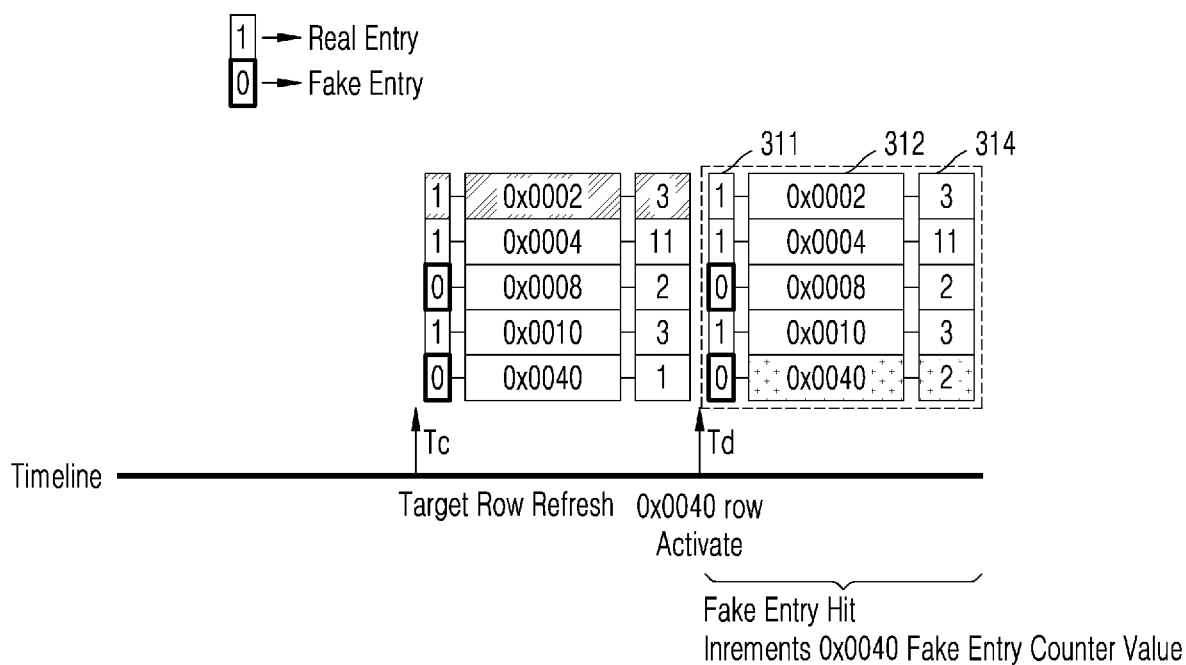

Operation S731 may be performed at the time point Td of FIG. 11. At the time point Td, the 0x0040 row address may be accessed. Because the 0x0040 row address matches the 0x0040 fake entry stored in the address table 310, the counter value of the 0x0040 fake entry is incremented by 1, so that the access counter value of the 0x0040 fake entry may be increased from 1 to 2.

In operation S732, it may be determined whether the count value of the fake entry in operation S731 is equal to or greater than the first threshold TH1 of 3 or greater. As a result of the determination, if the count value of the fake entry is not equal to or greater than the first threshold TH1 (NO), the operation of the control logic circuit 220 is terminated and the process may proceed to operation S733. Fake entries equal to or greater than the first threshold may be promoted to real entries Hereinafter, operations S733 to S736 may correspond to the promotion and demotion operations for the fake entries and the real entries in FIG. 6.

In operation S733, the control logic circuit 220 may determine whether the real entry space assigned to the address table 310 is full (i.e., there is no empty space in the address table 310). As a result of the determination, if there is an empty space in the address table 310 (NO), the process may proceed to operation S736; however, if there is no empty space in the address table 310 (YES), the process may proceed to operations 734 and 735. In operation S736, the control logic circuit 220 may promote a fake entry having the number of accesses greater than or equal to the first threshold TH1 to a real entry and store the fake entry in the real entry space of the empty space in the address table 310.

In operation S734, the control logic circuit 220 may select a real entry having the lowest number of accesses, among the real entries stored in the address table 310, and swap the selected real entry with a fake entry because there is no real entry space in the address table 310 to store the fake entry promoted to the real entry. Accordingly, the real entry having the lowest number of accesses may be demoted to a fake entry, and the fake entry having the number of accesses greater than or equal to the first threshold may be promoted to a real entry.

In operation S735, the control logic circuit 220 may initialize the access count value of the demoted real entry to the first value. The first value may be set to a value that is less than the first threshold value TH1. For example, the first value may be set to 2 that is less than the first threshold value TH1 of 3.

Figure 9:
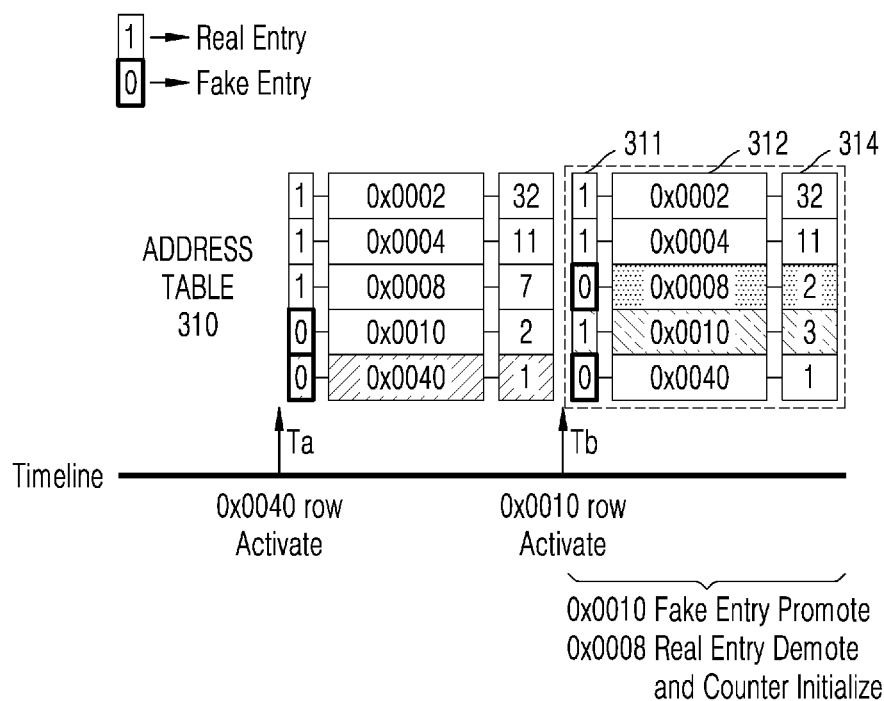

Operations S730 to S735 may be performed at the time point Tb of FIG. 9. At the time point Tb, the 0x0010 row address may be accessed. The control logic circuit 220 may determine that the received 0x0010 row address matches the fake entry stored in the address table 310 (operation S730), and increase the counter value of the 0x0010 fake entry stored in the address table 310 by 1 (S731), so that the access counter value of the 0x0010 fake entry may be increased from 2 to 3.

The 0x0010 fake entry having the access count value greater than or equal to the first threshold TH1 of 3 may be promoted to a real entry (operation S732). Here, because there is no real entry space in the address table 310 to store the fake entry promoted to the real entry (operation S733), the 0x0008 real entry having the lowest number of accesses of 7, among the real entries stored in the address table 310, may be swapped with the 0x0010 fake entry (operation S734).

The entry identifier 311 of the 0x0010 fake entry may be changed from "0" bit to "1" bit to indicate a real entry, and the entry identifier 311 of the 0x0008 real entry may be changed from "1" bit to "0" bit to indicate a fake entry. Accordingly, the 0x0008 real entry may be demoted to a fake entry, and the 0x0010 fake entry may be promoted to a real entry (operation S734). The access count value of the demoted real entry may be initialized to a first value, that is, 2.

Figure 10:
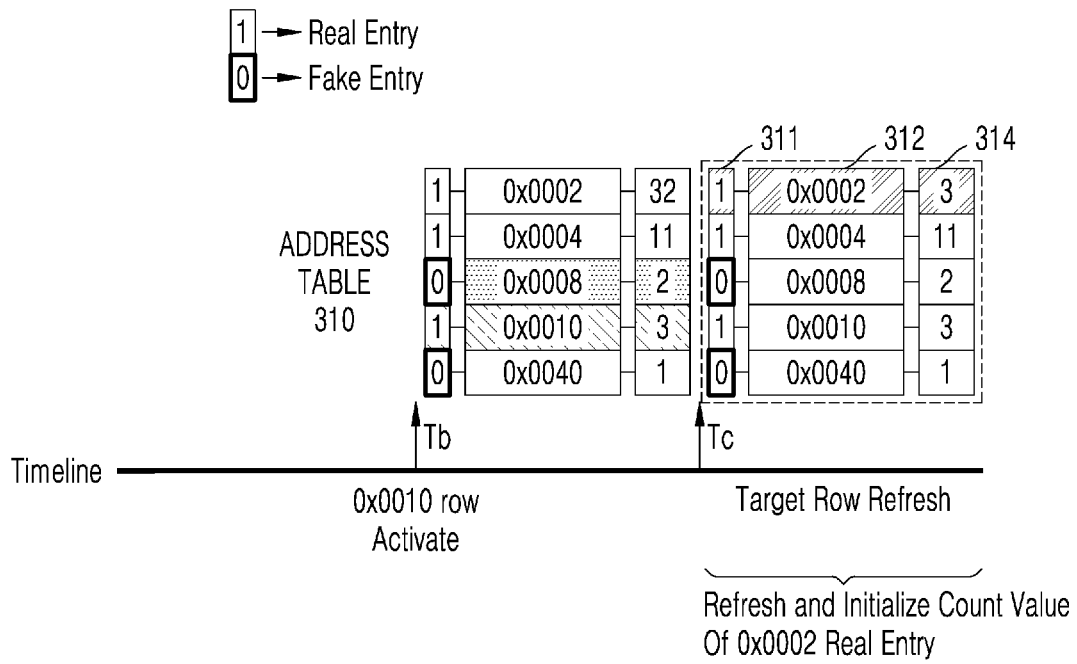

Operation S650 of performing the target row refresh operation of FIG. 6 may be performed at the time point Tc of FIG. 10. At the time point Tc, the control logic circuit 220 may perform a target row refresh operation on rows that are adjacent a row indicated by the 0x0002 real entry, which as the maximum number of accesses of 32, among the real entries stored in the address table 310. The control logic circuit 220 may initialize the access count value of the 0x0002 real entry corresponding to the target row refresh operation to a value (e.g., 3), which is the same as the first threshold value TH1.

Figure 12:
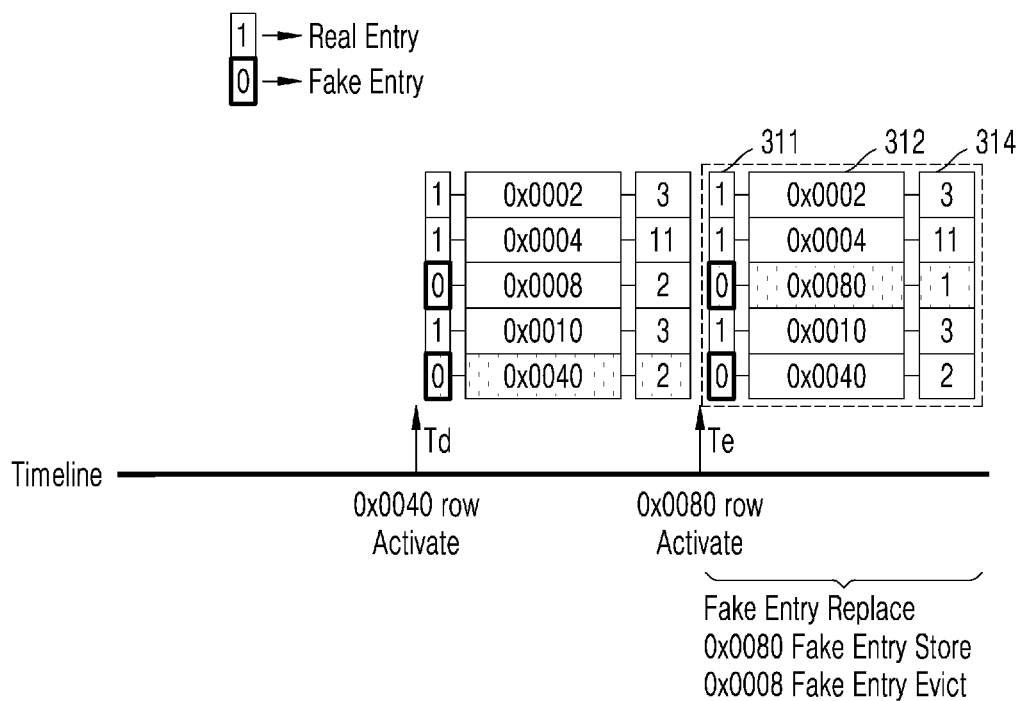

Operations S740 and S741 of evicting the fake entry of FIG. 7 may be performed at the time point Te of FIG. 12. At the time point Te of FIG. 12, a new 0x0080 row address may be accessed. Because there is no fake entry space in the address table 310 to store the 0x0080 fake entry having the access counter value of 1 (operation S730), the control logic circuit 220 may selectively evict one of 0x0008 and 0x0040 fake entries having the lowest number of accesses of 2, among the fake entries stored in the address table 310 (operation S740). FIG. 12 shows an example in which the 0x0008 fake entry is evicted. The control logic circuit 220 may store the 0x0080 fake entry having the access counter value of 1 in the address table 310 from which the 0x0008 fake entry is evicted (operation S741).

Figure 13:
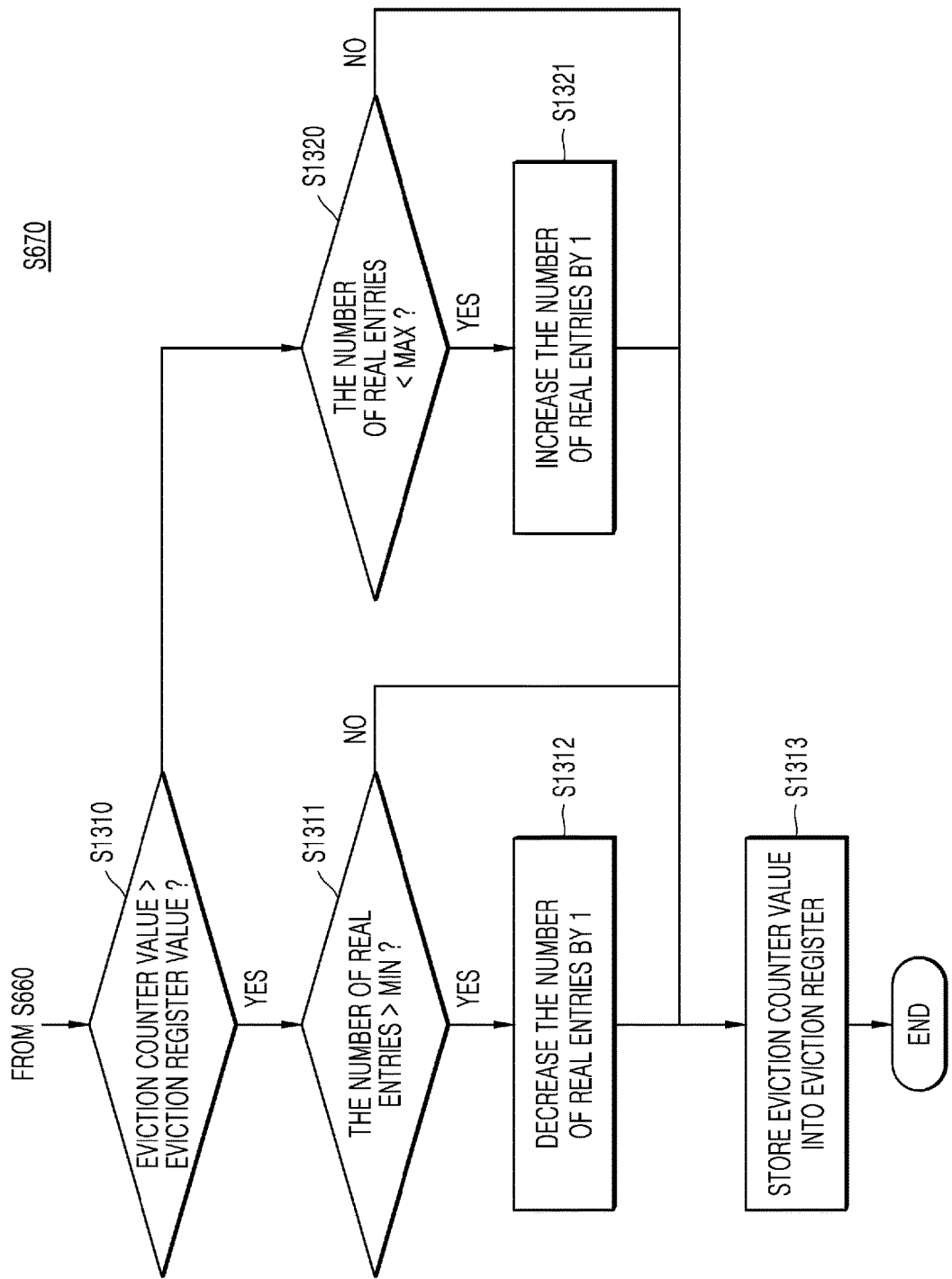
FIG. 13 is a flow diagram illustrating an operation of a control logic circuit according to example embodiments.

FIG. 13 is a flow diagram illustrating an operation of a control logic circuit according to example embodiments. FIG. 13 is a flow diagram illustrating the operation (operation S660) of adjusting the ratio of fake entries to real entries stored in the address table 310 described above with reference to FIG. 6.

Referring to FIG. 13 in conjunction with FIGS. 1 to 6, after performing the target row refresh operation of operation S650, in operation S1310, the control logic circuit 220 may compare a first number of evictions during a previous row hammer monitoring time frame stored in the eviction register 340 with a second number of evictions during a current row hammer monitoring time frame stored in the eviction counter 370. As a result of the comparison, if the second number of evictions is greater than the first number of evictions (YES), that is, if the fake entries are accessed a relatively large number of times during the current row hammer monitoring time frame, the process may proceed to operation S1311. As a result of the comparison, if the second number of evictions is less than the first number of evictions (NO), that is, if the fake entries are accessed a relatively less number of times, during the current row hammer monitoring time frame, the process may proceed to operation S1320.

In operation S1311, the control logic circuit 220 may determine whether the number of real entries in the address table 310 is greater than the minimum entry value MIN assigned to the address table 310. As a result of the determination, if the number of real entries is greater than the minimum entry value MIN (YES), the process may proceed to operations S1312 and S1313; however, if the number of real entries is less than the minimum entry value MIN (NO), the process may proceed to operation S1313.

In operation S1312, the control logic circuit 220 may reduce the number of real entries in the address table 310 by 1. This is to reduce the number of real entries, because fake entries are accessed a relatively large number of times during the current row hammer monitoring time frame.

In operation S1313, the control logic circuit 220 may store the second number of evictions of the eviction counter 370 in the eviction register 340. The second number of evictions during the current row hammer monitoring time frame stored in the eviction register 340 may be compared with a third number of evictions to be stored in the eviction counter 370 during a next row hammer monitoring time frame.

In operation S1320, the control logic circuit 220 may determine whether the number of real entries in the address table 310 is less than the maximum entry value MAX assigned to the address table 310. As a result of the determination, if the number of real entries is less than the maximum entry value MAX (YES), the process may proceed to operation S1321; however, if the number of real entries is greater than the maximum entry value MAX (NO), the process may proceed to operation S1313.

In operation S1321, the control logic circuit 220 may increase the number of real entries in the address table 310 by 1. This is to expand the number of real entries, because the fake entries are accessed a relatively less number of times during the current row hammer monitoring time frame.

Figure 14:
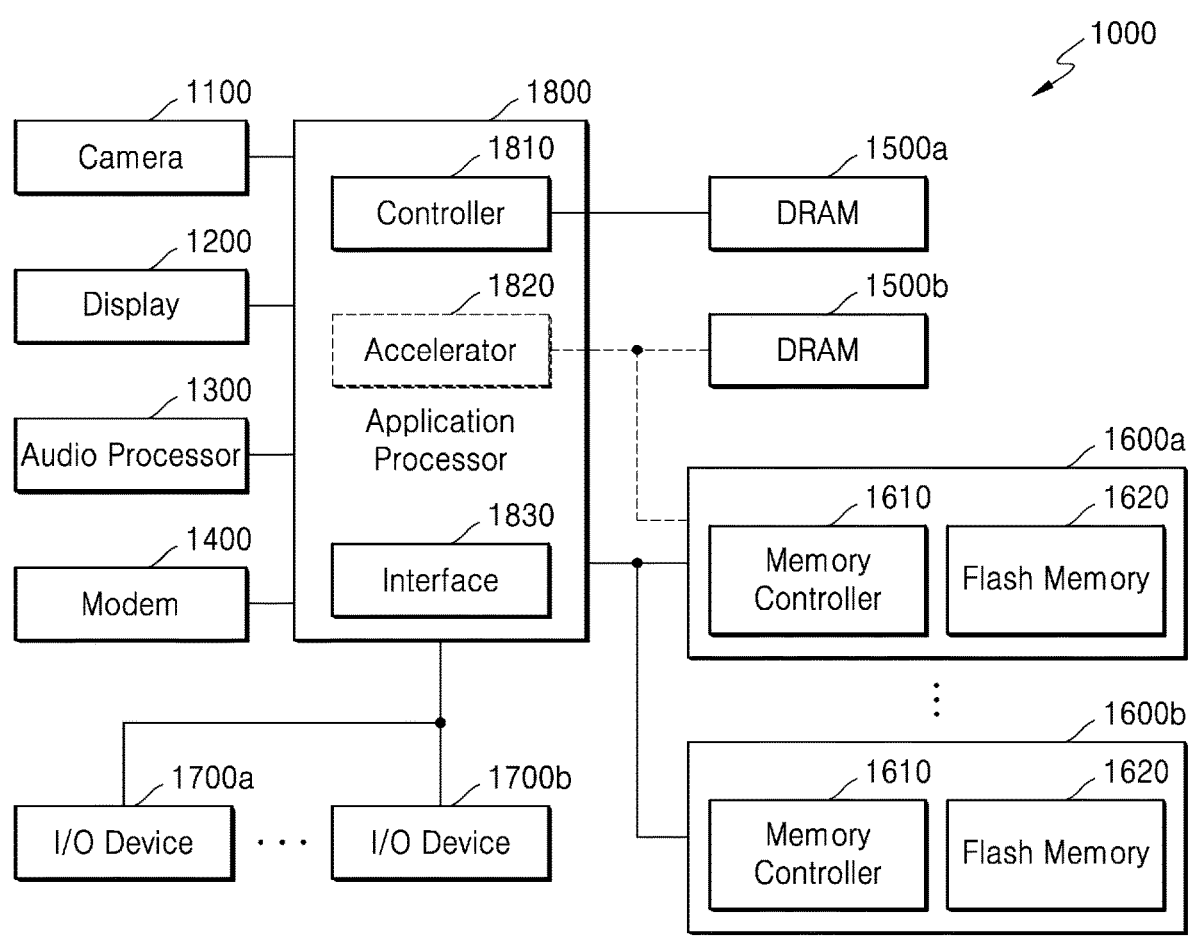
FIG. 14 is a block diagram illustrating a system including a memory device controlling a row hammer according to example embodiments.

FIG. 14 is a block diagram illustrating a system 1000 including a memory device for controlling a row hammer according to example embodiments.

Referring to FIG. 14, the system 1000 may include a camera 1100, a display 1200, an audio processor 1300, a modem 1400, DRAMs 1500a and 1500b, flash memories 1600a and 1600b, I/O devices 1700a and 1700b, and an AP 1800. The system 1000 is implemented as a laptop computer, a mobile phone, a smartphone, a tablet personal computer, a wearable device, a healthcare device, or an Internet Of Things (JOT) device. In addition, the system 1000 may be implemented as a server or a personal computer.

The camera 1100 may capture a still image or video and may store captured image/video data or transmit the captured image/video data to the display 1200 according to user's control. The audio processor 1300 may process audio data included in the content of the memories 1600a and 1600b or a network. The modem 1400 may modulate and transmit a signal to transmit/receive wired/wireless data, and a receiver may demodulate the modulated signal to recover an original signal. The I/O devices 1700a and 1700b may include a digital input and/or output function such as a universal serial bus (USB) or storage, a digital camera, a secure digital (SD) card, a digital versatile disc (DVD), a network adapter, and a touch screen.

The AP 1800 may control an overall operation of the system 1000. The AP 1800 may control the display 1200 so that a portion of the content stored in the flash memories 1600a and 1600b is displayed on the display 1200. When a user input is received through the I/O devices 1700a and 1700b, the AP 1800 may perform a control operation corresponding to the user input. The AP 1800 may include an accelerator block, which is a dedicated circuit for an artificial intelligence (AI) data operation, or may include an accelerator chip 1820 separately from the AP 1800. The DRAM 1500b may be additionally mounted on the accelerator block or the accelerator chip 1820. The accelerator, which is a function block that professionally performs a certain function of the AP 1800, may include a GPU as a function block professionally performs graphic data processing, a neutral processing unit (NPU) as a block professionally performing AI calculation and inference, and a data processing unit (DPU) as a block professionally performing data transmission.

The system 1000 may include a plurality of DRAMs 1500a and 1500b. The AP 1800 may set a DRAM interface protocol for communication to control the DRAMs 1500a and 1500b through a command and MRS setting conforming to the JEDEC standard or use company-specific functions such as low voltage/high speed/reliability and cyclic redundancy check (CRC)/error correction code (ECC) functions. For example, the AP 1800 may communicate with the DRAM 1500a through an interface conforming to JEDEC standards such as LPDDR4 and LPDDR5, and the accelerator block or the accelerator chip 1820 may set a new DRAM interface protocol for communication to control the DRAM 1500b for an accelerator having a bandwidth higher than that of the DRAM 1500a.

Only the DRAMs 1500a and 1500b are illustrated in FIG. 14, but without being limited thereto, any memory such as phase-change random access memory (PRAM), static random access memory (SRAM), magnetic random access memory (MRAM), resistive random access memory (RRAM), ferroelectric random access memory (FRAM) or hybrid RAM may be used if a bandwidth, response speed, and voltage conditions of the AP 1800 or the accelerator chip 1820 are satisfied. The DRAMs 1500a and 1500b have relatively smaller latency and bandwidth than the I/O devices 1700a and 1700b or the flash memories 1600a and 1600b. The DRAMs 1500a and 1500b may be initialized when the system 1000 is powered on, loaded with an operating system and application data, and used as temporary storage locations for the operating system and application data or as execution spaces for a variety of software code.

In the DRAMs 1500a and 1500b, addition/subtraction/multiplication/division operations, vector operations, address operations, or fast Fourier transform (FFT) operations may be performed. In addition, a function used for inference may be performed in the DRAMs 1500a and 1500b. Here, the inference may be performed in a deep learning algorithm using an artificial neural network. The deep learning algorithm may include a training operation of learning a model through a variety of data and an inference operation of recognizing data with the learned model. As an example embodiment, an image captured by the user through the camera 1100 is signal-processed and stored in the DRAM 1500b, and the accelerator block or accelerator chip 1820 may perform an AI data operation of recognizing data using data stored in the DRAM 1500b and a function used for inference.

The system 1000 may include a plurality of storages or a plurality of flash memories 1600a and 1600b having a larger capacity than the DRAMs 1500a and 1500b. The accelerator block or accelerator chip 1820 may perform a training operation and an AI data operation by using the flash memories 1600a and 1600b. In an example embodiment, the flash memories 1600a and 1600b may perform the training operation and inference AI data operation performed by the AP 1800 and/or the accelerator chip 1820 more efficiently using a computing device included in the memory controller 1610. The flash memories 1600a and 1600b may store pictures taken through the camera 1100 or data received through a data network. For example, augmented reality/virtual reality, high definition (HD), or ultra high definition (UHD) content may be stored.

In the system 1000, the DRAMs 1500a and 1500b may include the row hammer control circuit described above with reference to FIGS. 1 to 13. The DRAMs 1500a and 1500b promote a fake entry having the number of accesses equal to or greater than the first threshold to a real entry, and allow less intensive row hammer addresses to be selectively evicted by adjusting the ratio of the first entry space assigned to the real entry and the second entry space assigned to the fake entry in the address table based on the number of evictions of a fake entry evicted from the address table, thereby alleviating a row hammer of the DRAMs 1500a and 1500b.

While aspects of example embodiments have been shown and described, it will be understood that various changes in form and details may be made therein without departing from the spirit and scope of the following claims.

What is claimed is:
1. A memory device comprising:
a memory cell array comprising a plurality of memory cell rows;
a control logic circuit configured to classify access addresses of the memory cell array as real entries and fake entries, manage address registers including bit identifiers respectively corresponding to the access addresses, each of the bit identifiers indicating whether an access address is classified as a real entry or a fake entry, and identify a row hammer address from among the access addresses, wherein each of the real entries indicates an access address having a number of accesses equal to or greater than a first threshold, and each of the fake entries indicates an access address having a number of accesses less than the first threshold; and
a refresh control circuit configured to refresh a memory cell row physically adjacent to a memory cell row indicated by the row hammer address during a row hammer monitoring time frame,
wherein the control logic circuit is further configured to promote a fake entry to a real entry based on the number of accesses of the fake entry being equal to or greater than the first threshold.

2. The memory device of claim 1, wherein the control logic circuit is further configured to control the address registers, and the address registers comprises:
an address storage comprising the bit identifiers respectively corresponding to the access addresses; and
a counter storage configured to store the number of accesses of each of the real entries and each of the fake entries.

3. The memory device of claim 2, wherein the control logic circuit is further configured to store the promoted fake entry as a real entry in a first entry space in the address registers assigned to the real entries.

4. The memory device of claim 3, wherein the control logic circuit is further configured to swap the real entry having a lowest number of accesses stored in the address registers with the promoted fake entry based on there being no empty space in the first entry space.

5. The memory device of claim 4, wherein the control logic circuit is further configured to demote the real entry having the lowest number of accesses to a fake entry and initialize an access count value of the demoted real entry to a first value that is less than the first threshold.

6. The memory device of claim 5, wherein the first value is less than the first threshold by 1.

7. The memory device of claim 1, wherein the control logic circuit is further configured to initialize an access count value corresponding to the row hammer address to the first threshold, based on the memory cell row physically adjacent to the memory cell row corresponding to the row hammer address being refreshed.

8. A memory device comprising:
a memory cell array comprising a plurality of memory cell rows;
a control logic circuit configured to classify access addresses of the memory cell array as a real entries and fake entries, manage address registers including bit identifiers respectively corresponding to the access addresses, each of the bit identifiers indicating whether an access address is classified as a real entry or a fake entry, and identify a row hammer address from among the access addresses, wherein each of the real entries indicates an access address having a number of accesses equal to or greater than a first threshold, and each of the fake entries indicates an access address having a number of accesses less than the first threshold; and
a refresh control circuit configured to refresh a memory cell row physically adjacent to a memory cell row indicated by the row hammer address during a row hammer monitoring time frame,
wherein the control logic circuit is further configured to adjust a ratio of a first entry space to a second entry space based on a number of evictions, the first entry space is assigned to the real entries, and the second entry space is assigned to the fake entries.

9. The memory device of claim 8, wherein the control logic circuit is further configured to control the address registers, and the address registers comprises:
an address storage comprising the bit identifiers respectively corresponding to the access addresses; and a counter storage configured to store the number of accesses of each of the real entries and each of the fake entries.

10. The memory device of claim 9, wherein the control logic circuit is further configured to receive a first access address and store the first access address as a first fake entry in the second entry space of the address registers.

11. The memory device of claim 10, wherein the control logic circuit is further configured to, based on there being no empty space in the second entry space, evict a second fake entry having a lowest number of accesses stored in the address registers from the address registers, store the first fake entry in a location of the second fake entry that has been evicted, and increase the number of evictions by 1.

12. The memory device of claim 10, wherein the control logic circuit is further configured to increase an access counter value of the first fake entry to 1 based on the first fake entry matching the fake entry stored in the address registers.

13. The memory device of claim 9, wherein the control logic circuit is further configured to store a first number of evictions during a previous row hammer monitoring time frame and adjust the ratio of the first entry space to the second entry space based on a comparison of the first number of evictions with a second number of evictions during a current row hammer monitoring time frame.

14. The memory device of claim 13, wherein the control logic circuit is further configured to reduce the first entry space based on the comparison indicating the second number of evictions is greater than the first number of evictions.

15. The memory device of claim 14, wherein the control logic circuit is further configured to reduce the first entry space by 1 based on the first entry space being greater than a minimum entry value assigned to the address registers.

16. The memory device of claim 13, wherein the control logic circuit is further configured to expand the first entry space based on the comparison indicating the second number of evictions is less than the first number of evictions.

17. The memory device of claim 14, wherein the control logic circuit is further configured to increase the first entry space by 1 based on the first entry space being less than a maximum entry value assigned to the address registers.

18. An operating method of a memory device including a plurality of memory cell rows, the operating method comprising:
classifying access addresses for a memory cell array as real entries and fake entries, wherein each of the real entries indicates an access address having a number of accesses equal to or greater than a first threshold, and each of the fake entries indicates an access address having a number of accesses less than the first threshold;
managing address registers including bit identifiers respectively corresponding to the access addresses, each of the bit identifiers indicating whether an access address is classified as a real entry or a fake entry;
identifying a row hammer address from among the access addresses;
promoting a fake entry to a real entry based on the number of accesses of the fake entry being equal to or greater than the first threshold; and
refreshing a memory cell row physically adjacent to a memory cell row indicated by the row hammer address during a row hammer monitoring time frame.

19. The operating method of claim 18, wherein the classifying comprises:
generating the bit identifiers respectively corresponding to the access addresses; and
storing the number of accesses of each of the real entries and each of the fake entries in the address registers.

20. The operating method of claim 19, further comprising:
storing a number of evictions of the fake entries evicted from the address registers; and
adjusting a ratio of a first entry space to a second entry space based on the number of evictions,
wherein the first entry space is assigned to the real entries, and the second entry space is assigned to the fake entries.

* * * * *